United States Patent
Choi et al.

(10) Patent No.: US 10,793,698 B2
(45) Date of Patent: Oct. 6, 2020

(54) THERMOPLASTIC COMPOSITE RESIN COMPOSITION FOR SHIELDING ELECTROMAGNETIC WAVES

(71) Applicants: Hyundai Motor Company, Seoul (KR); Kia Motors Corporation, Seoul (KR); Hanwha Compound, Yeosu, Jeollanam-do (KR)

(72) Inventors: Seung Woo Choi, Seoul (KR); Min Jae Kim, Daejeon (KR); Jong Sung Park, Incheon (KR); Byoung Chul Park, Daejeon (KR); Jin Soo Han, Daejeon (KR)

(73) Assignees: Hyundai Motor Company, Seoul (KR); Kia Motors Corporation, Seoul (KR); Hanwha Compound, Yeosu, Jeollanam-do (KR)

(*) Notice: Subject to any disclaimer, the term of this patent is extended or adjusted under 35 U.S.C. 154(b) by 314 days.

(21) Appl. No.: 15/843,154

(22) Filed: Dec. 15, 2017

(65) Prior Publication Data

US 2019/0092924 A1 Mar. 28, 2019

(30) Foreign Application Priority Data

Sep. 25, 2017 (KR) .......................... 10-2017-0123775

(51) Int. Cl.
| | | |
|---|---|---|
| *C08K 7/06* | (2006.01) | |
| *H01B 1/24* | (2006.01) | |
| *C08K 3/04* | (2006.01) | |
| *C08K 9/08* | (2006.01) | |
| *H05K 9/00* | (2006.01) | |
| *H02G 3/08* | (2006.01) | |

(52) U.S. Cl.
CPC .................. *C08K 7/06* (2013.01); *C08K 3/04* (2013.01); *C08K 3/041* (2017.05); *C08K 9/08* (2013.01); *H01B 1/24* (2013.01); *H05K 9/009* (2013.01); *H05K 9/0083* (2013.01); *C08K 2201/001* (2013.01); *C08K 2201/003* (2013.01); *C08K 2201/004* (2013.01); *C08K 2201/005* (2013.01); *C08K 2201/006* (2013.01); *C08K 2201/011* (2013.01); *C08K 2201/014* (2013.01); *C08K 2201/016* (2013.01); *H02G 3/081* (2013.01)

(58) Field of Classification Search
CPC ...................................................... C08K 3/041
See application file for complete search history.

(56) References Cited

U.S. PATENT DOCUMENTS 6,528,572 B1* 3/2003 Patel ........................ C08K 3/04
524/495

FOREIGN PATENT DOCUMENTS

| KR | 10-2011-0072946 A | 6/2011 |
| KR | 10-2013-0067126 | 6/2013 |

* cited by examiner

*Primary Examiner* — Peter F Godenschwager
(74) *Attorney, Agent, or Firm* — Mintz Levin Cohn Ferris Glovsky and Popeo, P.C.; Peter F. Corless

(57) ABSTRACT

Provided herein is a thermoplastic composite resin composition for shielding electromagnetic waves that may exhibit excellent mechanical properties and superior electromagnetic wave shielding performance without including a metal material.

15 Claims, No Drawings

THERMOPLASTIC COMPOSITE RESIN COMPOSITION FOR SHIELDING ELECTROMAGNETIC WAVES

CROSS-REFERENCE TO RELATED APPLICATION

This application claims, under 35 U.S.C. § 119(a), the benefit of priority to Korean Patent Application No. 10-2017-0123775 filed on Sep. 25, 2017, the entire contents of which are incorporated herein by reference.

TECHNICAL FIELD

The present invention relates to a thermoplastic composite resin composition for shielding electromagnetic waves that may exhibit excellent mechanical properties and electromagnetic wave shielding performance without including a metal material.

BACKGROUND

Electronic components has been substantially used in all industries and high performance of electronic components has brought about high integration of electronic components. Electronic components emit electromagnetic waves. Because malfunctions of electronic devices may be caused by electromagnetic wave interference between electronic devices and the risk of magnetic waves to human body arise, regulations on electromagnet waves have been strengthened. In addition, development of technology for shielding electromagnetic waves has become more important. In particular, as various electronic control devices have been developed with improvement of convenience and safety of vehicles and development of eco-friendly vehicles in the vehicle industry, there has been increasing demand for shielding electromagnetic emission noise that induces malfunctions between electronic components in vehicles.

In the related art, metal materials have been widely used to shield electromagnetic waves. For instance, the metal has been used as a material for shielding electromagnetic waves in a variety of fields because it has better electrical conductivity than other materials and thus exhibits excellent reflectivity. However, the metal may have drawbacks of being heavy and difficulty in being molded into complicated shapes, and thus may cause low productivity and high production costs. As such, the vehicle industry may require an alternative material that may replace a metal having high specific gravity, along with an issue as to weight reduction.

In the related art, research has been actively conducted to produce electroconductive polymer composite materials, which are lighter and are more productive due to ease of molding than metal materials. However, composite materials for shielding electromagnetic waves that have been developed to date generally may have electromagnetic wave shielding levels of about 30 dB (@1 GHz) which are much less than metal materials. Meanwhile, increase of a conductive filler in a polymer resin may be inevitable to develop polymer composite materials having electromagnetic wave shielding efficiency not less than 40 dB. Although the increased content of the conductive filler may improve electromagnetic wave shielding performance of polymer composite materials, addition of large amounts of conductive filler may result in problems such as increased specific gravity, rapid deterioration in mechanical properties and incomplete injection molding of products.

In recent years, a high conductivity polymer composite material including a carbon-based filler coated with a metal such as nickel having superior electrical properties has been developed. However, such material may require an additional metal coating process, thus manufacturing cost may increase compared to a carbon-based filler under the same content condition and being low in economic efficiency. Accordingly, there is an increasing need for developing economically efficient polymer composite materials for shielding electromagnetic waves having excellent mechanical properties and electromagnetic wave shielding performance, without using a metal material.

The above information disclosed in this Background section is only for enhancement of understanding of the background of the invention and therefore it may contain information that does not form the prior art that is already known in this country to a person of ordinary skill in the art.

SUMMARY OF THE INVENTION

In preferred aspects, the present invention may provide a thermoplastic composite resin composition for shielding electromagnetic waves that may exhibit excellent mechanical properties and electromagnetic wave shielding performance, despite excluding a metal material. In one aspect, provided is a thermoplastic composite resin composition for shielding electromagnetic waves. The resin composition may include: (A) a thermoplastic resin, (B) a carbon fiber, (C) carbon nanotube, and (D) carbon black. The carbon fiber (B) may be a chopped carbon fiber surface-coated with an epoxy resin or a polyamide resin. Preferably, (B) the carbon fiber may include (B-1) a carbon fiber having a mean diameter of about 5 to 30 μm and a length of about 10 to 12 mm and a (B-2) carbon fiber having a mean diameter of about 5 to 30 μm and a length of about 6 to 8 mm In other aspect, the thermoplastic composite resin composition may consist essentially of, essentially consist of, or consist of the components as described above. For instance, the composition may consist essentially of, essentially consist of, or consist of: (A) the thermoplastic resin; (B) the carbon fiber; (C) the carbon nanotube; and (D) the carbon black, wherein the carbon fiber is a chopped carbon fiber surface-coated with an epoxy resin or a polyamide resin, and the carbon fiber comprises (B-1) a carbon fiber having a mean diameter of about 5 to 30 μm and a length of about 10 to 12 mm and (B-2) a carbon fiber having a mean diameter of about 5 to 30 μm and a length of about 6 to 8 mm.

The thermoplastic resin may suitably include one or more selected from the group consisting of polyamide, polybutylene terephthalate, polyethylene terephthalate, polycarbonate, polyphenylene oxide and polyphenylene sulfide.

The carbon nanotube may suitably include multi-wall carbon nanotube (MWCNT) having a mean diameter of about 1 to 50 nm, a length of about 500 to 30,000 nm, and an aspect ratio of about $2 \times 10^3$ to $2 \times 10^5$.

The carbon black may suitably include spherical carbon black having a mean particle diameter of about 15 to 40 nm and a nitrogen adsorption specific surface area of about 800 $m^2/g$ or less.

Preferably, the thermoplastic composite resin composition may include: 100 parts by weight of the thermoplastic resin; about 15 to 20 parts by weight of the carbon fiber having a length of about 10 to 12 mm and about 10 to 20 parts by weight of the carbon fiber having a length of about 6 to 8 mm, as the carbon fiber; about 1 to 5 parts by weight of the carbon nanotube; and about 1 to 10 parts by weight of the carbon black, all parts by weights are relative to the 100 parts by weight of the thermoplastic resin.

In other preferred aspect, the thermoplastic composite resin composition may consist essentially of, essentially consist of, or consist of: 100 parts by weight of the thermoplastic resin; about 15 to 20 parts by weight of the carbon fiber having a length of about 10 to 12 mm and about 10 to 20 parts by weight of the carbon fiber having a length of about 6 to 8 mm, as the carbon fiber; about 1 to 5 parts by weight of the carbon nanotube; and about 1 to 10 parts by weight of the carbon black, all parts by weights are relative to the 100 parts by weight of the thermoplastic resin.

The thermoplastic composite resin composition may further include an additive selected from the group consisting of an antioxidant, a lubricant, a compatibilizer, a colorant, a release agent, a flame retardant and a plasticizer. Preferably, the additive may be present in an amount of about 0.1 to 10 parts by weight, based on 100 parts by weight of the thermoplastic resin.

The thermoplastic composite resin composition may have a density measured in accordance with ASTM D792 of about 1.4 g/cm$^3$ or less, a tensile strength measured in accordance with ASTM D638 of about 2,000 kgf/cm$^2$ or greater, a melt index measured in accordance with ASTM D1238 of about 5 g/10 min or greater, and an electromagnetic wave shielding efficiency of about 60 dB or greater at a frequency of 1 GHz.

Also provided is an article produced by extruding and injecting the thermoplastic composite resin composition described above. For example, the article may be used for a vehicle high-voltage junction box.

Further provided is a vehicle comprising the article as described above.

Other aspects and preferred embodiments of the invention are discussed infra.

DETAILED DESCRIPTION

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprise", "include", "have", etc. when used in this specification, specify the presence of stated features, regions, integers, steps, operations, elements and/or components but do not preclude the presence or addition of one or more other features, regions, integers, steps, operations, elements, components, and/or combinations thereof.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Further, unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, reference will be made in detail to various embodiments of the present invention, examples of which are illustrated in the accompanying drawings and described below. While the invention will be described in conjunction with exemplary embodiments, it will be understood that the present description is not intended to limit the invention to the exemplary embodiments. On the contrary, the invention is intended to cover not only the exemplary embodiments, but also various alternatives, modifications, equivalents and other embodiments, which may be included within the spirit and scope of the invention as defined by the appended claims. In the following description of the present invention, detailed descriptions of known functions and configurations incorporated herein will be omitted when it may obscure the subject matter of the present invention.

The present invention provides a thermoplastic composite resin composition for shielding electromagnetic waves that may exhibit excellent mechanical properties and electromagnetic wave shielding performance, despite excluding a metal material.

The thermoplastic composite resin composition for shielding electromagnetic waves according to the present invention may include: (A) a thermoplastic resin, (B) a carbon fiber, (C) carbon nanotube and (D) carbon black. Preferably, the carbon fiber (B) may include two types of carbon fibers having different lengths, such that excellent electromagnetic wave shielding performance, superior mechanical properties and high flowability may be obtained through increases of connection between carbon fibers and conductive routes.

Respective components constituting the thermoplastic composite resin composition for shielding electromagnetic waves according to the present invention will be described below in more detail.

(A) Thermoplastic Resin

The thermoplastic resin may include one or more selected from the group consisting of polyamide, polybutylene terephthalate, polyethylene terephthalate, polycarbonate, polyphenylene oxide and polyphenylene sulfide.

The thermoplastic resin may preferably include polyamide. The polyamide resin may include an amide group in a polymer main chain and may be produced by polymerizing amino acid, lactam or diamine and dicarboxylic acid, as main ingredients. Non-limiting examples of the polyamide may include poly(caprolactam) (PA6), poly(11-aminoundecanoic acid) (PA11), poly(lauryl lactam) (PA12), poly(hexamethylene adipamide) (PA66), poly(hexaethylene azelamide) (PA69), poly(hexaethylene sebacamide) (PA610), poly(hexaethylene dodecanamide) (PA612) and the like. In addition, the polyamide may include a copolymer of aforementioned polyamides, specifically, polyamide 6/610, polyamide 6/66, polyamide 6/12 or the like. The polyamide may be used alone or as a mixture thereof in an appropriate ratio.

(B) Carbon Fiber

The carbon fiber may suitably be a pan- or pitch-based carbon fiber. For instance, a chopped carbon fiber, which may be a carbon fiber surface-coated with an epoxy resin or a polyamide resin, may be suitably used. When other polymer material excluding the epoxy resin or polyamide resin is used as the polymer material coated on the surface of the carbon fiber, adhesive strength between the carbon fiber and the polymer material may be deteriorated and uniform dispersion of the carbon fiber may not be induced, which may deteriorate physical properties of the thermoplastic composite resin.

In general, the shielding efficiency of the polymer composite material for shielding electromagnetic waves may increase, as electrical conductivity increases. The electrical conductivity may depend on the conductive filler added to the polymer composite material. In addition, electrical behaviors in the polymer composite material for shielding electromagnetic waves may be determined by contact between conductive fillers. In addition, as contact between the conductive fillers may increase, electrical conductivity increases due to increased conductive routes. Accordingly, as the aspect ratio of carbon fibers increases, shielding efficiency may increase. Furthermore, as the length of carbon fibers increases, the length of fiber-reinforcing composite material may increase. However, when carbon fibers are excessively long, melt index may be decreased due to poor dispersion of fibers in the composite material, thus disadvantageously causing deterioration in injection moldability.

The present invention may provide optimum selection conditions of carbon fibers which may satisfy mechanical properties, electromagnetic wave shielding performance and moldability of composite materials, while considering these general factors.

The present invention preferably provides the resin composition including two or more carbon fibers with different lengths in order to satisfy all of mechanical properties, electromagnetic wave shielding performance and moldability of composite materials.

In one preferred aspect, the thermoplastic composite resin composition may include, as a carbon fiber, a mixture of (B-1) a carbon fiber having a mean diameter of about 5 to 30 μm and a length of about 10 to 12 mm with (B-2) a carbon fiber having a mean diameter of about 5 to 30 μm and a length of about 6 to 8 mm.

The carbon fibers (B-1 and B-2) may include carbon fibers having a mean diameter ranging from about 5 to 30 μm, or particularly from about 5 to 10 μm in order to satisfy electromagnetic wave shielding efficiency.

In addition, the length of the carbon fiber included in the thermoplastic composite resin composition according to the present invention may suitably be about 12 mm or less. As the length of carbon fiber increases, electromagnetic wave shielding efficiency may increase due to increased contact between the conductive fillers, but homogenous dispersion of carbon fiber may not be induced. Therefore, the present invention may satisfy both electromagnetic wave shielding efficiency and moldability by limiting the maximum length of carbon fiber to about 12 mm In addition, the carbon fiber included in the thermoplastic composite resin composition may have a length of about 6 mm or greater. When the length of the carbon fiber is less than about 6 mm, electromagnetic wave shielding performance may be deteriorated due to insufficient contact between conductive fillers.

The thermoplastic composite resin composition may suitably include about 15 to 20 parts by weight of the carbon fiber (B-1) having a mean diameter of about 5 to 30 μm and a length of about 10 to 12 mm, and about 10 to 20 parts by weight of the carbon fiber (B-2) having a mean diameter of about 5 to 30 μm and a length of about 6 to 8 mm, based on 100 parts by weight of the thermoplastic resin.

The carbon fiber having a length of about 10 to 12 mm and the carbon fiber having a length of about 6 to 8 mm may have different properties due to different lengths thereof. For example, (B-1) the carbon fiber may have improved mechanical properties and electromagnetic wave shielding efficiency, but may have reduced dispersibility and thus may deteriorate injection moldability due to greater length compared to (B-2) the carbon fiber. On the other hand, (B-2) the carbon fiber may improve injection moldability, but may deteriorate mechanical properties and electromagnetic wave shielding efficiency due to less length than the carbon fiber (B-1). Accordingly, the present invention provides a technology capable of simultaneously satisfying mechanical properties, electromagnetic wave shielding performance and moldability of composite materials by suitably mixing carbon fibers having different lengths.

Accordingly, when the content of (B-1) the carbon fiber having a length of about 10 to 12 mm is less than about 15 parts by weight, based on 100 parts by weight of the thermoplastic resin, mechanical properties and electromagnetic wave shielding efficiency may be deteriorated, and when the content thereof is greater than about 20 parts by weight, dispersibility of the filler in the composite resin may be reduced and product injection moldability may thus be deteriorated. In addition, when the content of (B-2) the carbon fiber having a length of about 6 to 8 mm is less than about 10 parts by weight, based on 100 parts by weight of the thermoplastic resin, mechanical properties and electromagnetic wave shielding efficiency may be deteriorated, and when the content thereof is greater than about 20 parts by weight, dispersibility of the filler in the composite resin may be reduced and product injection moldability may thus be deteriorated.

(C) Carbon Nanotube

The carbon nanotube may be incorporated in order to improve the mechanical properties, electrical conductivity and thermal stability of the thermoplastic composite resin composition according to the present invention. The carbon nanotube may be classified into single wall carbon nanotube, double wall carbon nanotube and multi-wall carbon nanotube depending on number of walls. There is no limit as to selection of carbon nanotube in the present invention, but multi-wall carbon nanotube (MWCNT) may be preferably used.

The carbon nanotube may have a mean diameter of about 1 to 50 nm, or particularly of about 10 to 20 nm; a length of about 500 nm or greater, or particularly of about 500 to 30,000 nm; and an aspect ratio of about $2 \times 10^3$ to $2 \times 10^5$, or particularly of about $7 \times 10^3$ to $8 \times 10^4$. When the carbon nanotube having the mean diameter, length and aspect ratio within the range defined above is used, electrical conductivity and moldability of the thermoplastic composite resin may be substantially improved. When the mean diameter of carbon nanotube is less than about 1 nm, dispersibility of carbon nanotube in the composite resin may be deteriorated and processability may be thus reduced, and when the mean diameter is greater than about 50 nm, electromagnetic wave shielding efficiency may be deteriorated. In addition, when the length of the carbon nanotube is less than about 500 nm, electromagnetic wave shielding efficiency may be deteriorated, and when the length is greater than about 30,000 nm, dispersibility of the carbon nanotube in the composite resin may be deteriorated and processability may thus be reduced.

Particularly, the thermoplastic composite resin composition according to the present invention may suitably include an amount of about 1 to 5 parts by weight of the carbon nanotube, based on 100 parts by weight of the thermoplastic resin. When the content of the carbon nanotube is less than about 1 part by weight, the electromagnetic wave shielding efficiency may be deteriorated and when the content is greater than about 5 parts by weight, dispersibility of the filler may be deteriorated and product moldability may thus be reduced.

(D) Carbon Black

The carbon black may suitably include spherical carbon black particles which have a mean particle diameter of about 15 to 40 nm and a nitrogen adsorption specific surface area of about 800 $m^2/g$, or particularly of about 600 to 800 $m^2/g$. When the mean particle diameter of the carbon black is less than about 15 nm, miscibility with thermoplastic resin may be deteriorated, and when the mean particle diameter is greater than about 40 nm, electromagnetic wave shielding efficiency may be significantly deteriorated. In addition, as the nitrogen adsorption specific surface area of carbon black increases, electromagnetic wave shielding effect may be improved, and when the nitrogen adsorption specific surface area is excessively increased, miscibility with the thermoplastic resin may be deteriorated and the outer appearance of products or moldability thereof may be deteriorated. Accordingly, the nitrogen adsorption specific surface area of carbon black may be preferably limited to a maximum of about 800 $m^2/g$.

Preferably, the thermoplastic composite resin composition according to the present invention may suitably include an amount of about 1 to 10 parts by weight of the carbon black, based on 100 parts by weight of the thermoplastic resin. When the content of the carbon black is less than about 1 part by weight, the electromagnetic wave shielding efficiency may be deteriorated and when the content is greater than about 10 parts by weight, dispersibility of the filler in the composite resin may be deteriorated and product moldability may be deteriorated.

(E) Additive

Optionally, the thermoplastic composite resin composition according to the present invention may further include an additive selected from the group consisting of an antioxidant, a lubricant, a compatibilizer, a colorant, a release agent, a flame retardant and a plasticizer. Any additive may be used without particular limitation in the present invention so long as it is commonly used in the art.

For example, the thermoplastic composite resin composition according to the present invention may suitably include an amount of about 1 to 10 parts by weight of the additive, based on 100 parts by weight of the thermoplastic resin. There is no particular limitation as to the content of the additive.

The thermoplastic composite resin composition according to the present invention having ingredients and composition ratio described above may have a density measured in accordance with ASTM D792 of about 1.4 $g/cm^3$ or less, or particularly of about 1.2 to 1.4 $g/cm^2$, a tensile strength measured in accordance with ASTM D638 of about 2,000 $kgf/cm^2$ or greater, or particularly of about 2000 to 2400 $kgf/cm^2$, a melt index measured in accordance with ASTM D1238 of about 5 g/10 min or greater, or particularly of about 5 to 35 g/10 min, an electromagnetic wave shielding efficiency of about 60 dB or greater at a frequency of 1 GHz, of about 60 to 75 dB at 1 GHz. Accordingly, the thermoplastic composite resin composition according to the present invention may be useful as a material for components used as vehicle high-voltage junction boxes.

Hereinafter, the present invention will be described in more detail with reference to examples. However, these examples are provided only for illustration of the present invention and should not be construed as limiting the scope of the present invention.

EXAMPLE

Examples 1 to 6 and Comparative Examples 1 to 11

Ingredients were weighed in accordance with the composition ratio shown in the following Tables 1 to 3 and were then fed into a twin screw extruder and hot-melt mixed to prepare a composite resin composition. First, a polyamide resin, an antioxidant and a lubricant were fed to a primary ingredient inlet of a twin screw extruder (L/D=44, Φ=32 mm) heated to a temperature of 250° C. In addition, carbon nanotube and carbon black were fed to a secondary inlet positioned in the middle of the twin screw extruder. In addition, the carbon fiber was fed to a third inlet located at the end of the twin screw extruder through the side feeder. The produced composite resin composition was dried in a hot air drier at a temperature of 90° C. for 4 hours, and a pellet specimen was produced using a 150t injection machine at an injection temperature of 285° C. The produced specimen was allowed to stand at a temperature of 23° C. and at a relative humidity of 50% for 48 hours. Then, physical properties of the specimen were measured by the following measurement method.

<Ingredients Used for Production of Composite Resin Composition>

(A) Polyamide resin: 1027BRT, polyamide (PA6) produced by Hyosung Co. Ltd.

(B) Carbon fiber (C/F): TRO6Q produced by Mitsubishi Rayon, chopped carbon fiber coated with 2.5 wt % of an epoxy resin (B-1): mean diameter of 5 to 30 μm, length of 12 mm
(B-2): mean diameter of 5 to 30 μm, length of 6 mm
(B-3): mean diameter of 5 to 30 μm, length of 3 mm (C) Carbon nanotube: multi-wall carbon nanotube (MW-CNT), CM-130 produced by Hanwha Chemical Corp., mean diameter: 12 nm, length: 20 μm (aspect ratio: $2 \times 10^4$)

(D) Carbon black (C/B): Chezacarb AC-80 produced by Unipetrol Inc. (mean particle diameter: 40 nm, nitrogen adsorption specific surface area: 800 $m^2/g$)

(E) Additive

Antioxidant: IRGANOX 1010 produced by CIBA chemical

Lubricant: Hi-Lube produced by Sinwon Chemical Co., Ltd.

<Details of Physical Property Evaluation>

(1) Density ($g/cm^3$): measured in accordance with ASTM D792

(2) Tensile strength ($kgf/cm^2$): measured under the condition of 5 mm/min in accordance with ASTM D638.

(3) Melt index (g/10 min): measured under the condition of 275° C./5 kg in accordance with ASTM D1238.

(4) Electromagnetic wave shielding efficiency (dB): measured at a frequency of 1 GHz in accordance with ASTM 4935.

(5) Moldability: evaluated depending on whether or not an injection product is molded.

TABLE 1

|  | Items |  | \multicolumn{6}{c}{Examples} |
| --- | --- | --- | --- | --- | --- | --- | --- | --- |
|  |  |  | 1 | 2 | 3 | 4 | 5 | 6 |
| Composition (parts by weight) | (A) PA6 |  | 100 | 100 | 100 | 100 | 100 | 100 |
|  | (B) Carbon fiber | B-1 | 20 | 20 | 20 | 15 | 15 | 15 |
|  |  | B-2 | 10 | 15 | 20 | 10 | 15 | 20 |
|  | (C) MWCNT |  | 5 | 5 | 5 | 5 | 5 | 5 |
|  | (D) Carbon black |  | 10 | 10 | 10 | 10 | 10 | 10 |
|  | (E) Additive | Antioxidant | 0.5 | 0.5 | 0.5 | 0.5 | 0.5 | 0.5 |
|  |  | Lubricant | 0.3 | 0.3 | 0.3 | 0.3 | 0.3 | 0.3 |
| Physical properties | Density (g/cm$^3$) |  | 1.302 | 1.316 | 1.328 | 1.289 | 1.303 | 1.316 |
|  | Tensile strength (kgf/cm$^2$) |  | 2148 | 2283 | 2301 | 2003 | 2022 | 2122 |
|  | Melt index (g/10 min) |  | 10.2 | 8.8 | 6.4 | 30.2 | 22.5 | 14.3 |
|  | Electromagnetic wave shielding efficiency (dB) |  | 67 | 71 | 74 | 60 | 61 | 64 |
|  | Moldability |  | Good | Good | Good | Good | Good | Good |

TABLE 2

|  | Items |  | \multicolumn{6}{c}{Comparative Examples} |
| --- | --- | --- | --- | --- | --- | --- | --- | --- |
|  |  |  | 1 | 2 | 3 | 4 | 5 | 6 |
| Composition (parts by weight) | (A) PA6 |  | 100 | 100 | 100 | 100 | 100 | 100 |
|  | (B) Carbon fiber | B-1 | 15 | 20 | 25 | 10 | 25 | 25 |
|  |  | B-2 | 5 | 5 | 5 | 10 | 10 | 15 |
|  | (B) MWCNT |  | 5 | 5 | 5 | 5 | 5 | 5 |
|  | (C) Carbon black |  | 10 | 10 | 10 | 10 | 10 | 10 |
|  | (E) Additive | Antioxidant | 0.5 | 0.5 | 0.5 | 0.5 | 0.5 | 0.5 |
|  |  | Lubricant | 0.3 | 0.3 | 0.3 | 0.3 | 0.3 | 0.3 |
| Physical properties | Density (g/cm$^2$) |  | 1.274 | 1.288 | 1.304 | 1.273 | 1.315 | 1.328 |
|  | Tensile strength (kgf/cm$^2$) |  | 1735 | 1985 | 2231 | 1661 | 2327 | 2411 |
|  | Melt index (g/10 min) |  | 45.7 | 18.4 | 3.2 | 52 | 1.2 | 0.8 |
|  | Electromagnetic wave shielding efficiency (dB) |  | 50 | 58 | 70 | 48 | 74 | 76 |
|  | Moldability |  | Good | Good | Bad | Good | Bad | Bad |

TABLE 3

|  | Items |  | \multicolumn{5}{c}{Comparative Examples} |
| --- | --- | --- | --- | --- | --- | --- | --- |
|  |  |  | 7 | 8 | 9 | 10 | 11 |
| Composition (parts by weight) | (A) PA6 |  | 100 | 100 | 100 | 100 | 100 |
|  | (B) Carbon fiber | B-1 | 10 | 10 |  | 20 | 30 |
|  |  | B-2 | 15 | 20 | 30 |  |  |
|  |  | B-3 |  |  |  | 10 |  |
|  | (C) MWCNT |  | 5 | 5 | 5 | 5 | 5 |
|  | (D) Carbon black |  | 10 | 10 | 10 | 10 | 10 |
|  | (E) Additive | Antioxidant | 0.5 | 0.5 | 0.5 | 0.5 | 0.5 |
|  |  | Lubricant | 0.3 | 0.3 | 0.3 | 0.3 | 0.3 |
| Physical properties | Density (g/cm$^2$) |  | 1.289 | 1.302 | 1.304 | 1.303 | 1.302 |
|  | Tensile strength (kgf/cm$^2$) |  | 1788 | 1920 | 1867 | 1915 | 2354 |
|  | Melt index (g/10 min) |  | 36.9 | 27.5 | 38 | 13.6 | 2.2 |
|  | Electromagnetic wave shielding efficiency (dB) |  | 53 | 55 | 46 | 53 | 73 |
|  | Moldability |  | Good | Good | Good | Good | Bad |

As shown in Table 1, the specimen produced from the thermoplastic composite resin composition according to the present invention satisfied the conditions including a density measured in accordance with ASTM D792 of 1.4 g/cm$^3$ or less, a tensile strength measured in accordance with ASTM D638 of 2,000 kgf/cm$^2$ or greater, a melt index measured in accordance with ASTM D1238 of 5 g/10 min or greater, and an electromagnetic wave shielding efficiency of 60 dB or grater at a frequency of 1 GHz.

Accordingly, the thermoplastic composite resin composition according to the present invention may be useful as a material for components used as vehicle high-voltage junction boxes.

The thermoplastic composite resin composition provided by the present invention may have a density of 1.4 g/cm³ or less and may thus be advantageous to reduce weight, compared to a conventional vehicle electronic component housing material including a metal material for shielding electromagnetic noise.

In addition, the thermoplastic composite resin composition provided by the present invention may have an electromagnetic wave shielding efficiency of 60 dB (or grater at a frequency of 1 GHz, thus similar or improved electromagnetic wave shielding efficiency may be obtained compared to a conventional composite material including a carbon-based filler coated with a metal and being considerably advantageous in terms of cost reduction of the composite material.

In addition, the thermoplastic composite resin composition provided by the present invention may include a reduced amount of conductive carbon material, thus improved appearance may be obtained and injection and extrusion molding may be improved, compared to a conventional composite material containing a great amount of conductive filler.

The invention has been described in detail with reference to various exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A thermoplastic composite resin composition for shielding electromagnetic waves comprising:
   (A) a thermoplastic resin;
   (B) a carbon fiber;
   (C) carbon nanotube; and
   (D) carbon black,
   wherein the carbon fiber is a chopped carbon fiber surface-coated with an epoxy resin or a polyamide resin, and
   the carbon fiber comprises (B-1) a carbon fiber having a mean diameter of about 5 to 30 μm and a length of about 10 to 12 mm and (B-2) a carbon fiber having a mean diameter of about 5 to 30 μm and a length of about 6 to 8 mm.

2. The thermoplastic composite resin composition of claim 1, consisting essentially of:
   (A) the thermoplastic resin;
   (B) the carbon fiber;
   (C) the carbon nanotube; and
   (D) the carbon black,
   wherein the carbon fiber is a chopped carbon fiber surface-coated with an epoxy resin or a polyamide resin, and
   the carbon fiber comprises (B-1) a carbon fiber having a mean diameter of about 5 to 30 μm and a length of about 10 to 12 mm and (B-2) a carbon fiber having a mean diameter of about 5 to 30 μm and a length of about 6 to 8 mm.

3. The thermoplastic composite resin composition of claim 1, consisting of:
   (A) the thermoplastic resin;
   (B) the carbon fiber;
   (C) the carbon nanotube; and
   (D) the carbon black,
   wherein the carbon fiber is a chopped carbon fiber surface-coated with an epoxy resin or a polyamide resin, and
   the carbon fiber comprises (B-1) a carbon fiber having a mean diameter of about 5 to 30 μm and a length of about 10 to 12 mm and (B-2) a carbon fiber having a mean diameter of about 5 to 30 μm and a length of about 6 to 8 mm.

4. The thermoplastic composite resin composition of claim 1, wherein the thermoplastic resin comprises one or more selected from the group consisting of polyamide, polybutylene terephthalate, polyethylene terephthalate, polycarbonate, polyphenylene oxide and polyphenylene sulfide.

5. The thermoplastic composite resin composition of claim 1, wherein the carbon nanotube comprises multi-wall carbon nanotube (MWCNT) having a mean diameter of about 1 to 50 nm, a length of about 500 to 30,000 nm, and an aspect ratio of about $2\times10^3$ to $2\times10^5$.

6. The thermoplastic composite resin composition of claim 1, wherein the carbon black comprises spherical carbon black having a mean particle diameter of about 15 to 40 nm and a nitrogen adsorption specific surface area of about 800 m²/g or less.

7. The thermoplastic composite resin composition of claim 1, wherein the thermoplastic composite resin composition comprises:
   100 parts by weight of the thermoplastic resin;
   about 15 to 20 parts by weight of the carbon fiber having a length of about 10 to 12 mm and about 10 to 20 parts by weight of the carbon fiber having a length of about 6 to 8 mm, as the carbon fiber;
   about 1 to 5 parts by weight of the carbon nanotube; and
   about 1 to 10 parts by weight of the carbon black,
   all the parts by weights are relative to the 100 parts by weight of the thermoplastic resin.

8. The thermoplastic composite resin composition of claim 1, wherein the thermoplastic composite resin composition consists essentially of:
   100 parts by weight of the thermoplastic resin;
   about 15 to 20 parts by weight of the carbon fiber having a length of about 10 to 12 mm and about 10 to 20 parts by weight of the carbon fiber having a length of about 6 to 8 mm, as the carbon fiber;
   about 1 to 5 parts by weight of the carbon nanotube; and
   about 1 to 10 parts by weight of the carbon black,
   all the parts by weights are relative to the 100 parts by weight of the thermoplastic resin.

9. The thermoplastic composite resin composition of claim 1, wherein the thermoplastic composite resin composition consists of:
   100 parts by weight of the thermoplastic resin;
   about 15 to 20 parts by weight of the carbon fiber having a length of about 10 to 12 mm and about 10 to 20 parts by weight of the carbon fiber having a length of about 6 to 8 mm, as the carbon fiber;
   about 1 to 5 parts by weight of the carbon nanotube; and
   about 1 to 10 parts by weight of the carbon black,
   all the parts by weights are relative to the 100 parts by weight of the thermoplastic resin.

10. The thermoplastic composite resin composition of claim 1, further comprising:
    an additive selected from the group consisting of an antioxidant, a lubricant, a compatibilizer, a colorant, a release agent, a flame retardant and a plasticizer.

11. The thermoplastic composite resin composition of claim 10, wherein the additive is present in an amount of about 0.1 to 10 parts by weight, based on 100 parts by weight of the thermoplastic resin.

12. The thermoplastic composite resin composition of claim 1, wherein the thermoplastic composite resin composition has a density measured in accordance with ASTM D792 of about 1.4 g/cm$^3$ or less, a tensile strength measured in accordance with ASTM D638 of about 2,000 kgf/cm$^2$ or greater, a melt index measured in accordance with ASTM D1238 of about 5 g/10 min or greater, and an electromagnetic wave shielding efficiency of about 60 dB or greater at a frequency of 1 GHz.

13. An article produced by extruding and injecting a thermoplastic composite resin composition of claim 1.

14. The article of claim 13, wherein the article is used for a vehicle high-voltage junction box.

15. A vehicle comprising an article of claim 13.

* * * * *